(12) United States Patent
Kim et al.

(10) Patent No.: US 7,864,154 B2
(45) Date of Patent: Jan. 4, 2011

(54) GATE DRIVING CIRCUIT FOR LIQUID CRYSTAL DISPLAY DEVICE AND METHOD OF DRIVING THE SAME

(75) Inventors: Do-Heon Kim, Busan (KR); Soo-Hwan Moon, Gumi-si (KR); Ji-Eun Chae, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 1041 days.

(21) Appl. No.: 11/646,466

(22) Filed: Dec. 28, 2006

(65) Prior Publication Data

US 2007/0290982 A1    Dec. 20, 2007

(30) Foreign Application Priority Data

Jun. 15, 2006    (KR) .................... 10-2006-0053875

(51) Int. Cl.
G09G 3/36    (2006.01)

(52) U.S. Cl. ......................... 345/100; 345/98

(58) Field of Classification Search ................. 345/100, 345/98

See application file for complete search history.

(56) References Cited

U.S. PATENT DOCUMENTS

2006/0049404 A1*    3/2006    Park et al. ...................... 257/59
2007/0086558 A1*    4/2007    Wei et al. ....................... 377/64

* cited by examiner

*Primary Examiner*—Amare Mengistu
*Assistant Examiner*—Joseph G Rodriguez
(74) *Attorney, Agent, or Firm*—McKenna Long & Aldridge LLP

(57) ABSTRACT

A gate driving circuit for a liquid crystal display device includes a plurality of shift register stages each including pull-up and pull-down transistors, wherein each of the pull-up and pull-down transistors is connected to a gate driving signal output terminal and controlled by voltages on first and second nodes, respectively, and wherein the pull-down transistors of a $(2n-1)$th shift register stage and a $(2n)$th shift register stage are connected to each other; and a control signal generating unit alternately supplying one of first and second control signals to the pull-down transistors of the $(2n-1)$th and $(2n)$th shift register stages and supplying the other of the first and second control signals to the pull-down transistors of the $(2n+1)$th and $(2n+2)$th shift register stages, wherein n is an positive integer.

17 Claims, 7 Drawing Sheets

GATE DRIVING CIRCUIT FOR LIQUID CRYSTAL DISPLAY DEVICE AND METHOD OF DRIVING THE SAME

This application claims the benefit of Korean Patent Application No. 2006-0053875, filed on Jun. 15, 2006, which is hereby incorporated by reference for all purposes as if fully set forth herein.

BACKGROUND OF THE INVENTION

1. Field of the Invention

The present invention relates to a liquid crystal display (LCD) device, and more particularly, to a gate driving circuit for an LCD device and a method of driving the LCD device using the same.

2. Discussion of the Related Art

Among the various types of flat panel display (FPD) devices, liquid crystal display (LCD) devices are widely used as monitors for notebook computers and desktop computers because of their excellent characteristics, such as light weight, portability and low power consumption. Specifically, active matrix type LCD devices having thin film transistors (TFTs) as switching elements are actively researched and developed because of their superiority in displaying moving images.

FIG. 1 is a schematic block diagram of a liquid crystal display device according to the related art, and FIG. 2 is a schematic view showing a liquid crystal display panel of the liquid crystal display device according to the related art. In FIGS. 1 and 2, the liquid crystal display device includes a liquid crystal display panel 2 and a liquid crystal module (LCM) driving circuit 26. The LCM driving circuit 26 includes an interface 10, a timing controller 12, a source voltage generator 14, a reference voltage generator 16, a data driver 18 and a gate driver 20. RGB data and timing sync signals, such as clock signals, horizontal sync signals, vertical sync signals and data enable signals, are input from an external driving system such as a personal computer to the interface 10. The interface 10 outputs the RGB data and the timing sync signals to the timing controller 12. For example, a low voltage differential signal (LVDS) interface and transistor logic (TTL) interface may be used for transmission of the RGB data and the timing sync signals. In addition, the interface 10 may be integrated in a single chip together with the timing controller 12.

A plurality of gate lines "GL1" to "GLn" and a plurality of data lines "DL1" to "DLm" are formed in the liquid crystal display panel 2 and are driven respectively by the gate driver 20 and the data driver 18. The plurality of gate lines "GL1" to "GLn" and the plurality of data lines "DL1" to "DLm" cross each other to define a plurality of pixel regions. For each pixel region P, a thin film transistor "TFT" is connected to the corresponding gate line and the corresponding data line, and a liquid crystal capacitor "LC" connected to the thin film transistor "TFT" is formed in each pixel region. The liquid crystal capacitor "LC" is turned on/off by the thin film transistor "TFT" to thereby modulate the transmittance of incident light through the pixel regions to display images.

The timing controller 12 generates data control signals for the data driver 18 that includes a plurality of data integrated circuits (ICs), and gate control signals for the gate driver 20 that includes a plurality of gate ICs. Moreover, the timing controller 12 outputs data signals to the data driver 18. The reference voltage generator 16 generates reference voltages using a digital-to-analog converter (DAC) in the data driver 18. The reference voltages are set up according to transmittance-voltage characteristics of the liquid crystal display panel 2. The data driver 18 determines the reference voltages for the data signals according to the data control signals and outputs the determined reference voltages to the liquid crystal display panel 2 to control a rotation angle of liquid crystal molecules of the liquid crystal capacitors.

The gate driver 20 controls the ON/OFF operation of the thin film transistors (TFTs) in the liquid crystal display panel 2 according to the gate control signals from the timing controller 12. The gate driver 20 sequentially enables the plurality of gate lines "GL1" to "GLn." Accordingly, the data signals from the data driver 18 are supplied to the pixels in the pixel regions of the liquid crystal display panel 2 through the TFTs. The source voltage generator 14 supplies source voltages to elements of the LCD device and a common voltage to the liquid crystal display panel 2.

Although not shown in FIGS. 1 and 2, the liquid crystal display device includes a backlight assembly including at least one lamp. The backlight assembly emits light onto the liquid crystal display panel 2.

FIG. 3 is a schematic block diagram showing the gate driver of FIG. 1 according to the related art. As shown in FIG. 3, the gate driver 20 includes a plurality of related art shift register stages "SR1" to "SRn". Each high level voltage (VDD), each low level voltage (VSS) and each clock signal (CLKs) are supplied to each shift register stage "SR1" to "SRn". Moreover, a start voltage "Vst" is supplied to a first shift register stage "SR1". The first shift register stage "SR1" outputs a first gate signal "Vg1" to a first gate line (of FIG. 2). The first gate signal "Vg1" output by the first shift register stage is provided as a start voltage of a second shift register "SR2". The second shift register "SR2" outputs a second gate signal "Vg2" to a second gate line (of FIG. 2) in response to the first gate signal "Vg1" output by the first shift register stage. In a similar manner, the plurality of shift registers "SR1" to "SRn" sequentially supply a plurality of gate signals "Vg1" to "Vgn" to a plurality of gate lines "GL1" to "GLn" as shown in FIG. 4.

FIG. 4 is a timing chart showing gate signals of the gate driver according to the related art. As shown in FIG. 4, the plurality of related art shift register stages "SR1" to "SRn" (of FIG. 3) sequentially supply the gate signals "Vg1" to "Vg5" respectively to the gate lines "GL1" to "GL5". Accordingly, a plurality of pixel TFTs "TFT" (of FIG. 2) connected to the plurality of gate lines "GL1" to "GL5" respectively, are sequentially turned on.

Each shift register stage "SR1" to "SRn" includes identical elements. As shown in FIG. 5, each of the shift register stages "SR1" to "SRn" includes pull-up and pull-down TFTs Tup and Tdn. The pull-up and pull-down TFTs Tup and Tdn each include an amorphous silicon layer as a semiconductor layer. If the pull-down TFT Tdn is driven under the high voltage for a long period of time, the pull-down TFT Tdn may be damaged.

SUMMARY OF THE INVENTION

Accordingly, the present invention is directed to a gate driving circuit for a liquid crystal display device and a method of driving the same that substantially obviates one or more of the problems due to limitations and disadvantages of the related art.

An advantage of the present invention is to provide a gate driving circuit for an LCD device that is capable of preventing a pull-down transistor from being damaged.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a gate driving circuit for a liquid crystal display (LCD) device includes a plurality of shift register stages each including pull-up and pull-down transistors, wherein each of the pull-up and pull-down transistors is connected to a gate driving signal output terminal and controlled by voltages on first and second nodes, respectively, and wherein the pull-down transistors of a (2n−1)th shift register stage and a (2)th shift register stage are connected to each other; and a control signal generating unit alternately supplying one of first and second control signals to the pull-down transistors of the (2n−1)th and (2n)th shift register stages and the other of the first and second control signals to the pull-down transistors of the (2n+1)th and (2n+2)th shift register stages, wherein n is an integer.

In another aspect of the present invention, a method of driving a gate driving circuit for a liquid crystal display (LCD) device including a plurality of shift register stages each including pull-up and pull-down transistors, wherein each of the pull-up and pull-down transistors is connected to a gate driving signal output terminal and each of the pull-up and pull-down transistors is controlled by voltages on first and second nodes, respectively, includes alternately supplying one of first and second control signals to the pull-down transistors of a (2n−1)th shift register stage and a (2n)th shift register stage and supplying the other of the first and second control signals to the pull-down transistors of a (2n−2)th shift register stage and a (2n−3)th shift register stage, wherein the pull-down transistors of the (2n−1)th and (2n)th shift register stages are connected to each other and wherein n is a positive integer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, examples of which are illustrated in the accompanying drawings.

Figure 1:
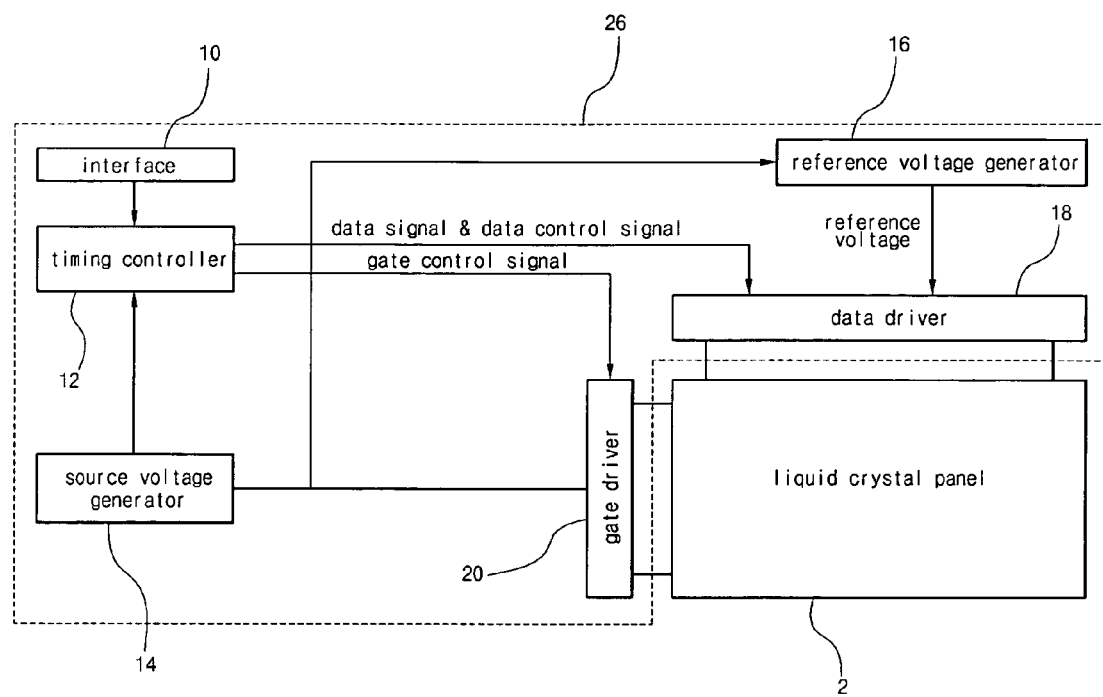
FIG. 1 is a schematic block diagram of a liquid crystal display device according to the related art.
Figure 2:
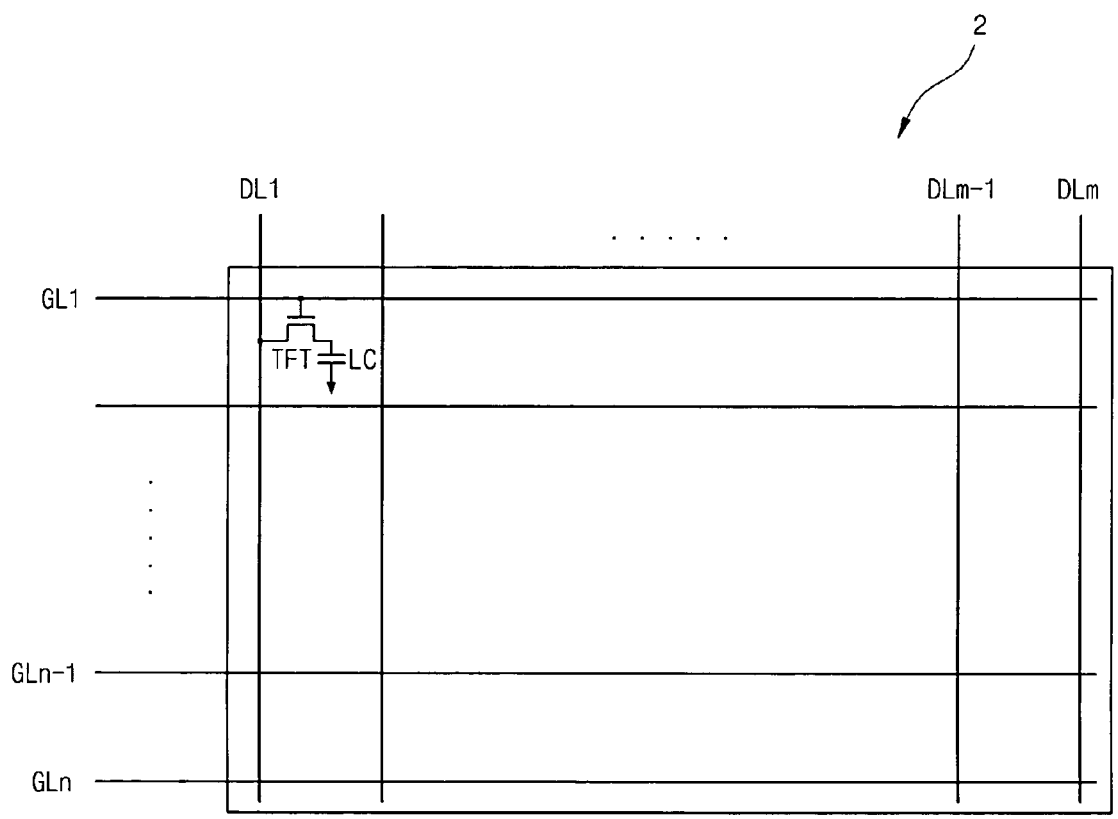
FIG. 2 is a schematic view showing a liquid crystal display panel of the liquid crystal display device according to the related art.
Figure 3:
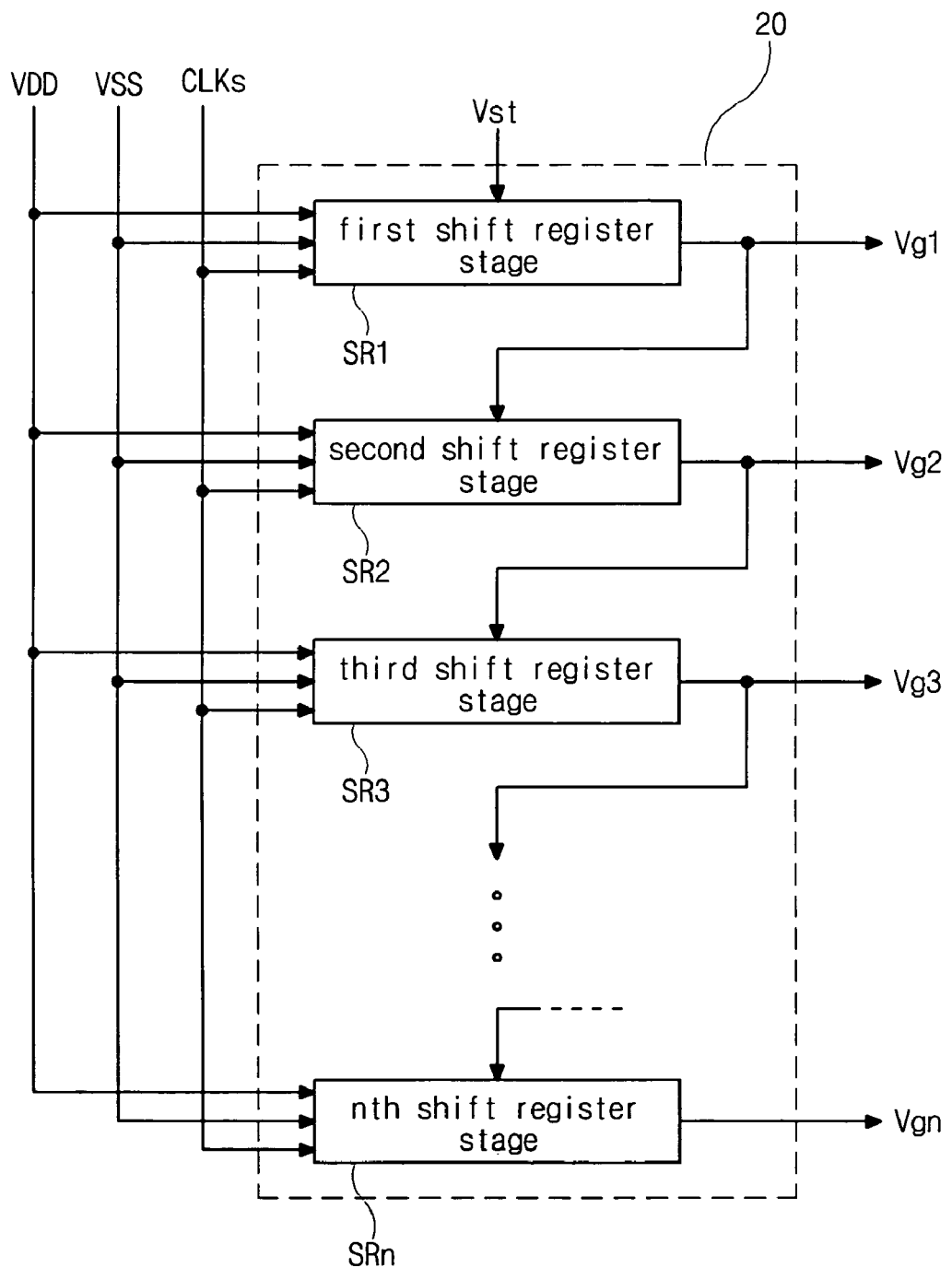
FIG. 3 is a schematic block diagram showing the gate driver of FIG. 1 according to the related art.
Figure 4:
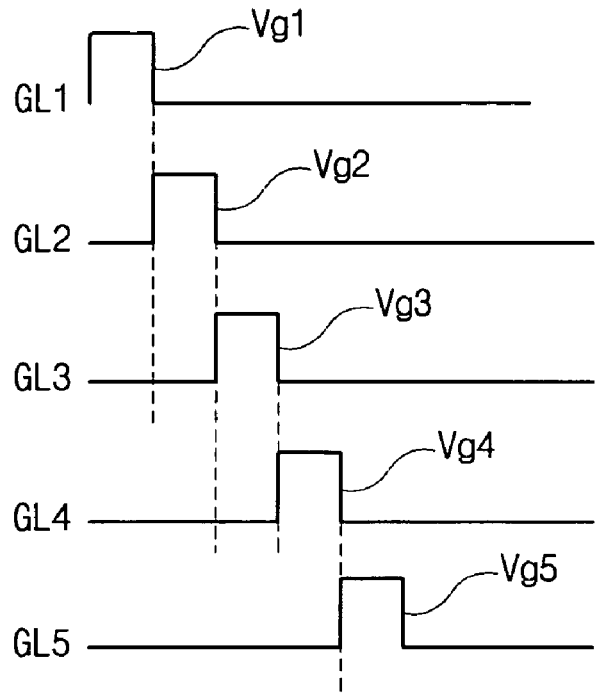
FIG. 4 is a timing chart showing gate signals of the gate driver of FIG. 3 according to the related art.
Figure 5:
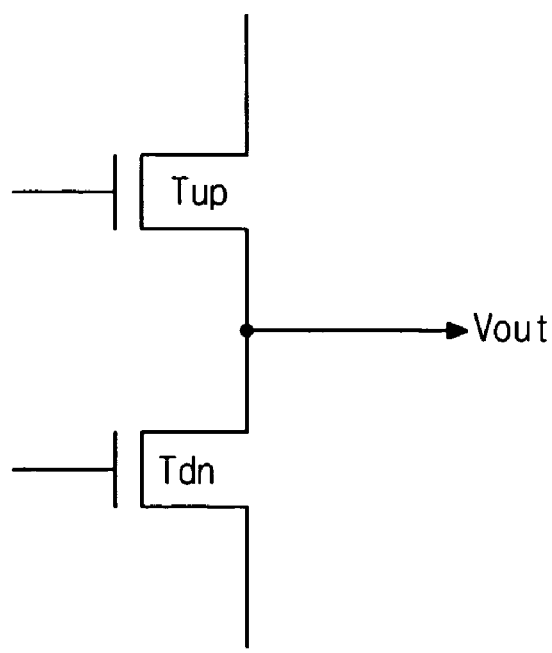
FIG. 5 is a circuit diagram of a shift register stage according to the related art.
Figure 6:
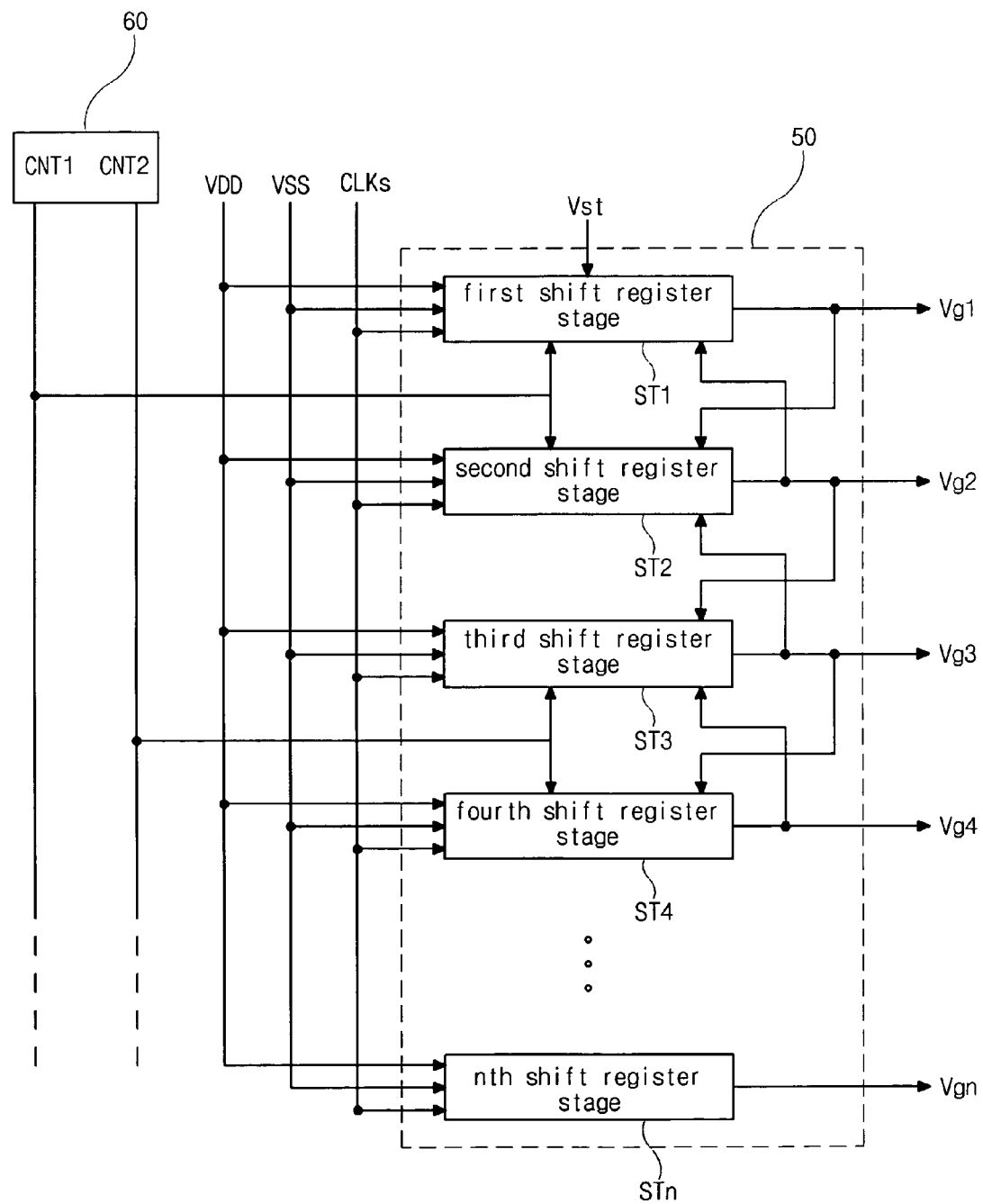
FIG. 6 is a schematic block diagram showing the gate driver according to an embodiment of the present invention.

FIG. 6 is a schematic block diagram showing the gate driver according to an embodiment of the present invention.

As shown in FIG. 6, the gate driver includes a stage unit 50 and a control signal supplying unit 60. The stage unit 50 includes a plurality of shift register stages "ST1" to "STn", and the control signal supplying unit 60 supplies first and second control signals CNT1 and CNT2. Each shift register stage "ST1" to "STn" includes a shift register circuit.

Moreover, the high level voltages (VDD), the low level voltages (VCC) and the clock signals (CLKS) are supplied to each shift register stage "ST1" to "STn". A first shift register stage "ST1" receives a first start voltage Vst with the high level voltage (VDD), the low level voltage (VCC) and the clock signal (CLKs) to thereby output the first gate signal Vg1. The first gate signal Vg1 is used as a start voltage of a second shift register "ST2". The second shift register "ST2" outputs a second gate signal "Vg2" to a second gate line in response to first gate signal Vg1 as a start voltage. In a similar manner, the plurality of shift registers "ST1" to "STn" sequentially supply a plurality gate signals "Vg1" to "Vgn" to a plurality of gate lines "GL1" to "GLn".

The control signal supplying unit 60 functions to prevent the pull-down TFT "TFT" from being damaged. To accomplish this result, the control signal supplying unit 60 alternately supplies the first and second control signals CNT1 and CNT2 to two pull-down TFTs "Tdn" of a pair of coupled shift register stages. The coupled shift register stages include (2N−1)th and (2N)th shift register stages among the plurality of shift register stages "ST1" to "STn".

In particular, when the first control signal CNT1 is supplied to the first and second shift register stages "ST1" and "ST2", the second control signal CNT2 is supplied to the third and fourth shift register stages "ST3" and "ST4". In addition, while the first control signal CNT1 is supplied to the fifth and sixth shift register stages "ST5" and "ST6", the second control signal CNT2 is supplied to the seventh and eighth shift register stages "ST7" and "ST8". The first control signal CNT1 has a high level signal during one-fourth of a cycle, and the second control signal CNT2 has a high level signal delayed as much as a half cycle from the first control signal CNT1.

In other words, the control signal supplying unit 60 supplies the first and second control signals CNT1 and CNT2 that support driving of each of the shift register stages "ST1" to "STn" to prevent damaging the pull-down TFT Tdn. Moreover, the control signal supplying unit 60 may be integrated with a gate and data control signal generating circuit in the timing controller.

Figure 7:
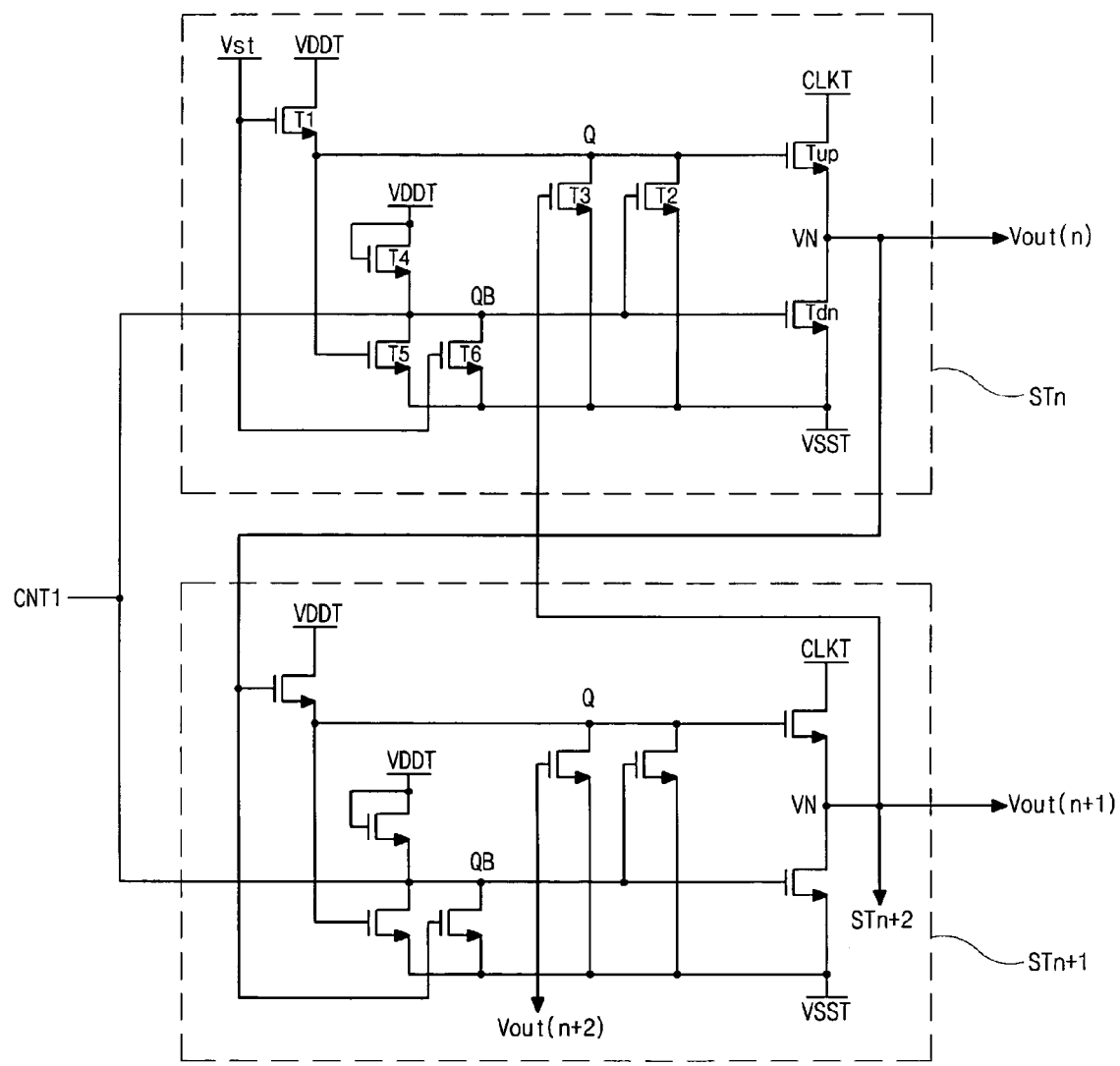
FIG. 7 is a circuit diagram of shift register stages according to an embodiment of the present invention.

FIG. 7 is a circuit diagram of shift register stages according to an embodiment of the present invention.

As shown in FIG. 7, each of nth and (n+1)th shift register stages "STn" and "Stn+1" includes the pull-up and pull-down TFTs "Tup" and "Tdn". The pull-up TFT "Tup" is connected to a clock signal input terminal "CLKT" and is controlled by a voltage of a Q node "Q". The pull-up TFT "Tup" supplies an nth gate driving signal "Vout(n)" to a gate driving signal output terminal "VN". The pull-down TFT "Tdn" is connected to the gate driving signal output terminal "VN" and a high level voltage input terminal "VSST" and is controlled by a voltage of a QB node "QB". In this case, the reference number "Vout(n)" means the nth gate signal "Vgn" (of FIG. 6).

Moreover, first to third TFT "T1" to "T3" are provided in the nth shift register stage "STn" for electrically charging and discharging of the Q node "Q". Fourth and sixth TFT "T4" to "T6" are disposed in the nth shift register stage "STn" for electrically charging and discharging of the QB node "QB".

The first TFT "T1" is connected to the high level voltage input terminal "VDDT" and is controlled by the start signal "Vst" to electrically charge the Q node "Q" with a high level voltage. The second TFT "T2" is connected to the Q node "Q" and a low level voltage input terminal "VSST" and is controlled by the voltage of the QB node "QB" to electrically discharge the Q node "Q". The third TFT "T3" is connected to the Q node "Q" and the low level voltage input terminal "VSST" and is controlled by an (n+1)th gate driving signal "Vout(n+1)" of an (n+1)th shift register stage "STn+1" to electrically discharge the Q node "Q".

The fourth TFT "T4" is connected to and controlled by the high level voltage input terminal "VDDT" to electrically charge the QB node "QB" to a high level voltage. The fifth TFT "T5" is connected to the QB node "QB" and the low level voltage input terminal "VSST" and is controlled by the voltage of the QB node "QB" to electrically discharge the QB node "QB". The sixth TFT "T6" is connected to the QB node "QB" and the low level voltage input terminal "VSST" and is controlled by the start signal "Vst" to electrically discharge the QB node "QB".

The pull-down TFTs "Tdn" in the above-mentioned coupled shift register stages "STn" and "Stn+1" are connected to each other. That is, the QB nodes "QB" in the nth and (n+1)the shift register stages "STn" and "STn+1" are connected to each other such that the same first control signal "CNT1" is commonly supplied to the nth and (n+1)th shift register stages "STn" and "STn+1". Similarly, the QB nodes "QB" in the (n+2) and (n+3) shift register stages "STn+2" and "Stn+3" are connected to each other such that the same second control signal "CNT2" (of FIG. 6) is commonly supplied to the (n+2) and (n+3)th shift register stages.

The first and sixth TFTs "T1" and "T6" of the nth stage each use an (n−1)th gate driving signal as the start signal (excluding the first stage which uses Vst as the start signal). The first and sixth TFTs "T1" to "T6" may each be of an identical transistor type such as a negative (NMOS) type.

The gate driver including the shift register, shown in FIG. 7, can prevent a high level voltage from being continuously supplied to the pull-down TFT "Tdn" to prevent damage to the pull-down TFT "Tdn".

Figure 8:
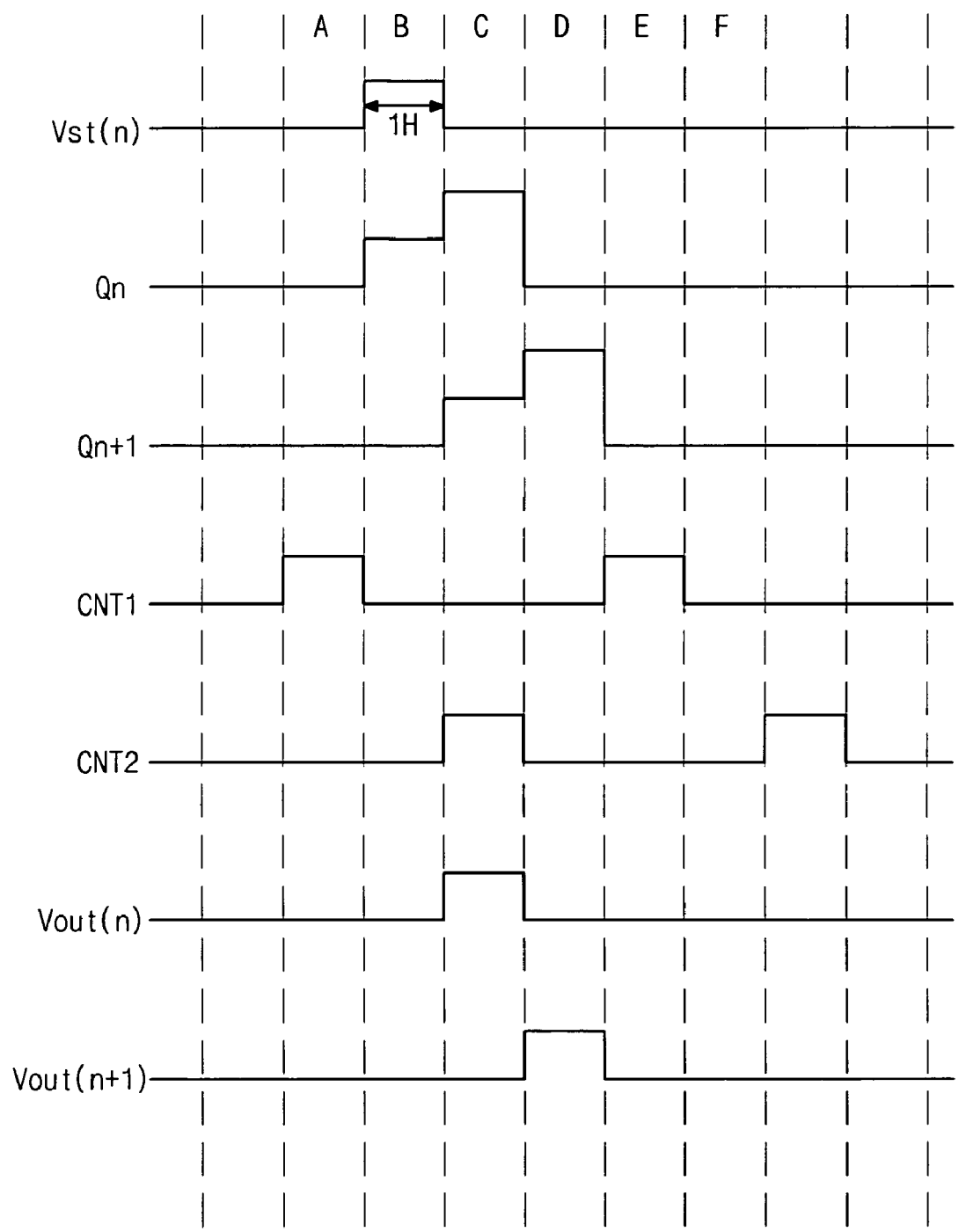
FIG. 8 is a timing chart showing gate signals of the gate driver of FIG. 6 for driving a liquid crystal display device.

FIG. 8 is a timing chart showing gate signals of the gate driver for driving a liquid crystal display. Since the nth and (n+1)th shift register stages are driven in a similar manner, the driving process of the nth shift register stage will be explained in detail.

As shown in FIG. 8, the Q node "Q" (of FIG. 7) of the nth shift register stage "STn" (of FIG. 7) is electrically discharged in an initial state. To establish the initial state, the first control signal "CNT1" is supplied the nth shift register stage "STn" (of FIG. 7) during one horizontal line period "1H", as shown in column A. When the first control signal "CNT1" is supplied to the nth shift register stage "STn" (of FIG. 7), the QB node "QB" (of FIG. 7) is electrically charged such that the second transistor "T2" turns on. Accordingly, the Q node "Q" (of FIG. 7) is electrically discharged with a low state. At the same time, since the QB nodes "QB" (of FIG. 7) in the nth and (n+1)th shift register stages "STn" (of FIG. 7) and "STn+1" (of FIG. 7) are connected to each other, the first control signal "CNT1" is supplied to the (n+1)th shift register stage "STn+1" (of FIG. 7) such that the Q node "Q" (of FIG. 7) of the (n+1)th shift register stage "STn+1" (of FIG. 7) is electrically discharged.

Next, as shown in column B of FIG. 8, the first and sixth TFTs "T1" (of FIG. 7) and "T6" (of FIG. 7) turn on in response to the start signal at Vst to electrically charge the Q node "Q" (of FIG. 7) using the first TFT "T1" (of FIG. 7) and to electrically discharge the QB node "QB" (of FIG. 7) using the sixth TFT "T6" (of FIG. 7).

Next, as shown in column C of FIG. 8, when a high level clock signal from the clock signal input terminal "CLKT" (of FIG. 7) is supplied to the pull-up TFT "Tup" (of FIG. 7), the Q node "Q" (of FIG. 7), which is electrically charged, is bootstrapped depending on the high level clock signal from the clock signal input terminal "CLKT" (of FIG. 7) by coupling effect of an parasitic capacity between the gate and drain electrode of the pull-up TFT "Tup" (of FIG. 7). As a result, a voltage of the Q node "Q" (of FIG. 7) is raised such that the pull-up TFT "Tup" (of FIG. 7) is fully turned on and the nth gate driving signal "Vout(n)" (of FIG. 7) is output.

At this time, since the (n+1) shift register stage "STn+1" (of FIG. 7) receives the nth gate driving signal "Vout(n)" (of FIG. 7) as the start signal, the driving of (n+1)th shift register stage "STn+1" (of FIG. 7) is delayed as much as one horizontal line period "1H" from the driving of the nth shift register stage "STn". Accordingly, an (n+1)th Q node signal "Qn", which is supplied to the Q node "Q" (of FIG. 7) is delayed as much one horizontal line period "1H" as an nth Q node signal "Qn+1". Since the nth and (n+1)th shift register stages "STn" (of FIG. 7) and "STn+1" (of FIG. 7) are driven with a difference of one horizontal line period (1H), a subsequent first control signal "CNT1" is supplied after three horizontal line periods (3H).

In addition, since a second pair of coupled shift register stages, for example an (n+2)th shift register stage and an (n+3)th shift register stage, is driven to be delayed as much as two horizontal line periods (2H) from the nth and (n+1)th shift register stages "STn" (of FIG. 7) and "STn+1" (of FIG. 7), a second control signal "CNT2" is supplied to the QB node "QB" (of FIG. 7) in the (n+2)th and (N+3)th shift register stages as much delayed by two horizontal line periods (2H) from the first control signal "CNT1". The (n+2)th and (N+3) th shift register stages are driven using the above-described driving processes with the second control signal "CNT2" used in place of the first control signal "CNT1".

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalent.

What is claimed is:

1. A gate driving circuit for a liquid crystal display (LCD) device, comprising:
    a plurality of shift register stages each including pull-up and pull-down transistors, wherein each of the pull-up and pull-down transistors is connected to a gate driving signal output terminal and controlled by voltages on first and second nodes, respectively, and wherein the pull-down transistors of a (2n−1)th shift register stage and a (2n)th shift register stage are connected to each other; and
    a control signal generating unit supplying one of first and second control signals except the other of the first and second control signals to the pull-down transistors of the (2n−1)th and (2n)th shift register stages in a first period and supplying the other of the first and second control signals except the one of the first and second control signals to the pull-down transistors of the (2n+1)th and (2n+2)th shift register stages in a second period, wherein n is an positive integer.

2. The gate driving circuit according to claim 1, wherein each of the plurality of shift register stages further includes a clock signal input terminal and a low level voltage input terminal, wherein the pull-up transistor is connected to the clock signal input terminal, and the pull-down transistor is connected to the low level voltage input terminal.

3. The gate driving circuit according to claim 1, wherein each of the plurality of shift register stages further includes a first node control unit for electrically charging and discharging the first node and a second node control unit for electrically charging and discharging the second node.

4. The gate driving circuit according to claim 3, wherein the first node control unit of the (2n−1)th shift register stage includes first, second and third transistors, wherein the first transistor is connected to a high level voltage input terminal and that electrically charges the first node in response to a first start signal, the second transistor is connected to a low level voltage input terminal and the first node and that electrically discharges the first node in response to a voltage of the second node, and the third transistor is connected to the low level voltage input terminal and the first node and that electrically discharges the first node in response to a second start signal.

5. The gate driving circuit according to claim 4, wherein the first start signal of a (2n−1)th stage is a gate driving signal of a (2n−2)th shift register stage output from the gate driving signal output terminal of the (2n−2)th shift register stage.

6. The gate driving circuit according to claim 4, wherein the second start signal for a (2n−1)th stage is a gate driving signal of the (2n)th shift register stage, which is output from the gate driving signal output terminal of the (2n)th shift register stage.

7. The gate driving circuit according to claim 3, wherein the second node control unit of the (2n−1)th shift register stage includes fourth, fifth and sixth transistors, wherein the fourth transistor is connected to and controlled by a high level voltage input terminal such that the second node is electrically charged, the fifth transistor is connected to a low level voltage input terminal and the second node and that electrically discharges the second node in response to a voltage of the first node, and the sixth transistor is connected to the low level voltage input terminal and that electrically discharges the second node in response to a third start signal.

8. The gate driving circuit according to claim 7, wherein the third start signal is a gate driving signal of a (2n−2)th shift register stage, which is output from the gate driving signal output terminal of the (2n−2)th shift register stage.

9. The gate driving circuit according to claim 1, wherein the pull-up and pull-down transistors are NMOS transistors.

10. The gate driving circuit according to claim 1, wherein the control signal generating unit outputs the first and second control signals having a high level during one-fourth cycle.

11. The gate driving circuit according to claim 10, wherein the second control signal is delayed from the first control signal by as much as one half cycle.

12. A method of driving a gate driving circuit for a liquid crystal display (LCD) device including a plurality of shift register stages each including pull-up and pull-down transistors, wherein each of the pull-up and pull-down transistors is connected to a gate driving signal output terminal and each of the pull-up and pull-down transistors is controlled by voltages on first and second nodes, respectively, comprising:
  supplying one of first and second control signals except the other of the first and second control signals to the pull-down transistors of a (2n−1)th shift register stage and a (2n)th shift register stage in a first period; and supplying the other of the first and second control signals except the one of the first and second control signals to the pull-down transistors of a (2n+1)th shift register stage and a (2n+2)th shift register stage in a second period, wherein the pull-down transistors of the (2n−1)th and (2n)th shift register stages are connected to each other and wherein n is a positive integer.

13. The method according to claim 12, wherein the first and second control signals are supplied with a high level during one-fourth cycle.

14. The method according to claim 13, wherein the second control signal is supplied as much delayed by a half cycle as the first control signal.

15. The method according to claim 14, wherein the first and second control signals are supplied to the (2n−1)th shift register stage before a gate driving signal of a (n−2)th shift register stage is supplied to the (2n−1)th shift register stage.

16. The method according to claim 15, wherein an nth shift register stage uses a gate driving signal of an (2n−1)th shift register stage as a start signal, which is output from the gate driving signal output terminal of the (2n−2)th shift register stage.

17. The method according to claim 16, wherein a first shift register stage uses a signal from an outer circuit as the start signal.

\* \* \* \* \*